United States Patent
Li et al.

(10) Patent No.: US 6,613,200 B2
(45) Date of Patent: Sep. 2, 2003

(54) ELECTRO-CHEMICAL PLATING WITH REDUCED THICKNESS AND INTEGRATION WITH CHEMICAL MECHANICAL POLISHER INTO A SINGLE PLATFORM

(75) Inventors: Shijian Li, San Jose, CA (US); Stan D. Tsai, Fremont, CA (US); Lizhong Sun, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 09/770,559

(22) Filed: Jan. 26, 2001

(65) Prior Publication Data

US 2003/0121797 A1 Jul. 3, 2003

(51) Int. Cl.⁷ .............................................. C25D 17/00
(52) U.S. Cl. .............. 204/198; 204/224 M; 204/224 R; 204/267; 204/275.1; 204/276; 204/297.01; 204/297.14
(58) Field of Search ........................ 204/224 R, 224 M, 204/297.01, 297.14, 275.1, 198, 267, 269, 263–266

(56) References Cited

U.S. PATENT DOCUMENTS

| | | | |
|---|---|---|---|
| 4,793,895 A | 12/1988 | Kaanta et al. | 156/627 |
| 4,934,102 A | 6/1990 | Leach et al. | 51/50 R |
| 5,217,586 A | 6/1993 | Datta et al. | 204/129.6 |
| 5,225,034 A | 7/1993 | Yu et al. | 156/636 |
| 5,453,312 A | 9/1995 | Haas et al. | 428/143 |
| 5,534,106 A | 7/1996 | Cote et al. | 156/636.1 |
| 5,543,032 A | 8/1996 | Datta et al. | 205/670 |
| 5,567,300 A | 10/1996 | Datta et al. | 205/652 |
| 5,575,706 A | 11/1996 | Tsai et al. | 451/41 |
| 5,692,950 A | 12/1997 | Rutherford et al. | 451/552 |

(List continued on next page.)

FOREIGN PATENT DOCUMENTS

| | | | |
|---|---|---|---|
| WO | 98/49723 | 11/1998 | ......... H01L/21/321 |
| WO | 00/26443 | 5/2000 | |
| WO | 00/59008 | 10/2000 | ........... H01L/21/00 |
| WO | 00/59682 | 10/2000 | ........... B24B/37/04 |

OTHER PUBLICATIONS

Dordi et al. "Electro–Chemical Deposition System" U.S. patent application Ser. No.: 09/289,074, filed Apr. 8, 1999.

Ettinger et al. "Method and Apparatus for Transferring Semiconductor Substrates Using an Input Module" U.S. patent application Ser. No.: 09/547,189. filed Apr. 11, 2000.

Tobin "Wafer Transfer Station for a Chemical Mechanical Polisher" U.S. patent application Ser. No. 09/414,771, filed May 21, 1997.

Birang et al. "Apparatus and Methods for Chemical Mechanical Polishing with an Advanceable Polishing Sheet" U.S. patent application Ser. No. 09/244,456, filed Feb. 4, 1999.

Primary Examiner—Donald R. Valentine
(74) Attorney, Agent, or Firm—Moser, Patterson & Sheridan

(57) ABSTRACT

An apparatus is provided for depositing and polishing a material layer on a substrate. In one embodiment, an apparatus is provided which includes a basin, a cover, a permeable disc, an anode and a polishing head. The permeable disc is disposed in the basin between the cover and the basin's bottom. The cover has an aperture disposed therein that includes a plurality of pins. The pins extend radially into the aperture and are adapted to support the substrate. The anode is disposed in the basin between the disc and the bottom of the basin. The polishing head is adapted to retain the substrate during processing and includes a retaining ring. The retaining ring has a plurality of grooves disposed therein that mate with the pins when the polishing head is disposed in the aperture. When the substrate is biased via the pins, the potential between the substrate and the anode causes material to be deposited on the substrate's surface.

31 Claims, 9 Drawing Sheets

U.S. PATENT DOCUMENTS

| | | | |
|---|---|---|---|
| 5,738,574 A | 4/1998 | Tolles et al. | 451/288 |
| 5,804,507 A | 9/1998 | Perlov et al. | 438/692 |
| 5,807,165 A | 9/1998 | Uzoh et al. | 451/41 |
| 5,846,882 A | 12/1998 | Birang | 438/692 |
| 5,911,619 A | 6/1999 | Uzoh et al. | 451/5 |
| 6,004,880 A | 12/1999 | Liu et al. | 438/692 |
| 6,024,630 A | 2/2000 | Shendon et al. | 451/41 |
| 6,066,030 A | 5/2000 | Uzoh | 451/41 |
| 6,090,239 A | 7/2000 | Liu et al. | 156/345 |
| 6,103,096 A | 8/2000 | Datta et al. | 205/686 |
| 6,132,587 A * | 10/2000 | Jorne et al. | 205/123 |
| 6,136,163 A | 10/2000 | Cheung et al. | 204/198 |
| 6,217,734 B1 * | 4/2001 | Uzoh | 205/118 |
| 6,228,231 B1 * | 5/2001 | Uzoh | 204/224 R |
| 6,234,870 B1 | 5/2001 | Uzoh et al. | 451/8 |
| 6,261,433 B1 * | 7/2001 | Landau | 205/96 |
| 2001/0024878 A1 | 9/2001 | Nakamura | 438/691 |

* cited by examiner

ELECTRO-CHEMICAL PLATING WITH REDUCED THICKNESS AND INTEGRATION WITH CHEMICAL MECHANICAL POLISHER INTO A SINGLE PLATFORM

CROSS REFERENCE TO OTHER RELATED APPLICATIONS

This application is related to U.S. patent application Ser. No. 09/739,139, titled "Integrated Multi-step Gap Fill and All Feature Planarization for Conductive Materials" and filed Dec. 18, 2000, which is hereby incorporated by reference in its entirety.

BACKGROUND OF THE INVENTION

1. Field of the Invention

The present invention relates to an apparatus and method for deposition and planarization of a material, such as a metal, on a substrate.

2. Background of the Related Art

Sub-quarter micron multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), chemical vapor deposition (CVD), plasma-enhanced chemical vapor deposition (PECVD), and electro-chemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing.

Chemical mechanical planarization, or chemical mechanical polishing (CMP), is a common technique used to planarize substrates. CMP utilizes a chemical polishing composition, typically a slurry or other fluid medium, for selective removal of material from substrates. In conventional CMP techniques, a substrate carrier or polishing head is mounted on a carrier assembly and positioned in contact with a polishing material in a CMP apparatus. The carrier assembly provides a controllable pressure to the substrate urging the substrate against the polishing material. Relative motion is then provided between the polishing material and the substrate while dispersing the polishing composition therebetween. The combined chemical and mechanical activity causes a controlled removal of material from the surface of the substrate, resulting in a generally planar substrate surface.

Copper is becoming a metal of choice in ULSI to form interconnects that provide conductive pathways in integrated circuits and other electronic devices. Copper is a material having advantageous properties such as lower resistance compared to traditionally used materials such as aluminum. Copper can be deposited by various techniques such as PVD, CVD and electroplating. Electroplating (ECP) is seen as a low cost and effective deposition technique with promise. ECP is generally performed by introducing a substrate into a plating bath and applying a potential between an anode disposed in the bath and the substrate (e.g., a seed layer form on the substrate). The copper ions plate out of solution and deposit onto the substrate.

However, copper is difficult to pattern and etch. Accordingly, copper features are formed using damascene or dual damascene processes. In damascene processes, a feature is defined in a dielectric material and subsequently filled with copper. The features typically have barrier materials deposited on their surfaces to form a conformal barrier layer. Copper is then deposited over the barrier layer and the surrounding field area. The copper deposited on the field is then removed by CMP to leave the copper filled feature. Both abrasive and abrasive-free CMP are currently available to remove copper.

To achieve complete planarization over wide features, it is necessary to deposit a copper thickness approximately 1.4–2.0 times that of the intra-level dielectric (ILD) thickness. For typical power lead levels, a 2.0 $\mu$m thick copper layer is required. However, the deposition of such a thick copper layer limits throughout of CMP processing.

One problem with CMP of copper is the tendency of copper surfaces to dish as a result of polishing. Dishing can result from copper over-polish used to clear all copper formed on the field across the wafer. One area where dishing may occur is in areas where conductive features exceed five microns. This is particularly problematic in some current designs where the conductive features are often greater than about fifty microns. To prevent excessive dishing in these areas during CMP processing, oxide pillars are typically interposed in these features to reduce the width of the conductive feature exposed to CMP processing. To reduce the cost of device fabrication, it would be advantageous to develop a deposition and planarizing apparatus and method that minimizes dishing and the need to use oxide pillars in large feature areas.

As a result, there is a need for an apparatus and method for depositing and polishing a metal layer, such as a copper layer, on a substrate.

SUMMARY OF THE INVENTION

The present invention generally provides an apparatus for depositing and polishing a material on a substrate. In one embodiment, the apparatus includes a basin, a cover, a permeable disc, an anode and a polishing head. The permeable disc is disposed in the basin between the cover and the basin's bottom. The cover has an aperture disposed therein that includes a plurality of pins. The pins extend radially into the aperture and are adapted to support the substrate. The anode is disposed in the basin between the disc and the bottom of the basin. The polishing head is adapted to retain the substrate during processing and includes a retaining ring. The retaining ring has a plurality of grooves disposed therein that mate with the pins when the polishing head is disposed in the aperture. When the substrate is electrically biased through the pins, the potential between the substrate and the anode causes material to be deposited on the substrate's surface.

In another embodiment, the apparatus additionally comprises one or more polishing stations disposed adjacent the cover.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE PREFERRED EMBODIMENT

Figure 1:
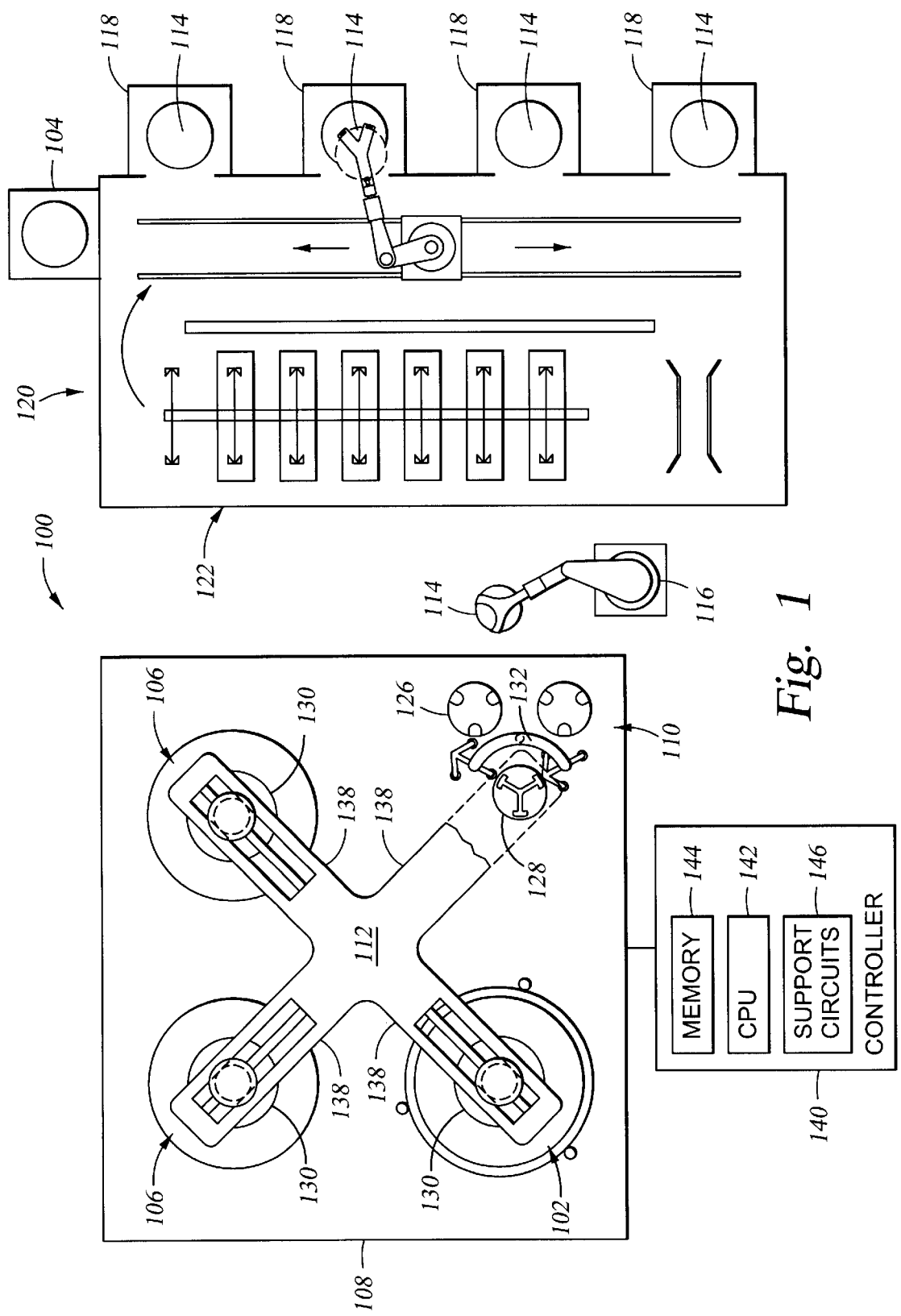
FIG. 1 is a plan view of one embodiment of a processing apparatus of the invention.

FIG. 1 depicts a processing apparatus 100 having at least one plating station 102 and at least one conventional polishing or buffing station 106 disposed on a single platform or tool. One polishing tool that may be adapted to benefit from the invention is a MIRRA® chemical mechanical polisher available from Applied Materials, Inc. located in Santa Clara, Calif. The exemplary apparatus 100 generally includes a base 108 that supports the plating station 102, the polishing station 106, a transfer station 110 and a carousel 112. The transfer station 110 generally facilitates transfer of substrates 114 to and from the apparatus 100 via a loading robot 116. The loading robot 116 typically transfers substrates 114 between the transfer station 110 and a factory interface 120 that may includes a cleaning module 122, a metrology device 104 and one or more substrate storage cassettes 118. One example of a metrology device 104 is a NovaScan™ Integrated Thickness Monitoring system, available from Nova Measuring Instruments, Inc., located in Phoenix, Ariz. Alternatively, the loading robot 116 (or factory interface 120) may transfer substrates to one or more other processing tools (not shown) such as a chemical vapor deposition tool, physical vapor deposition tool, etch tool and the like. An example of such a factory interface 120 that may be used to advantage is disclosed in U.S. patent application Ser. No. 09/547,189, filed Apr. 2, 2000 by Ettinger, et al., which is hereby incorporated by reference in its entirety.

In one embodiment, the transfer station 110 comprises at least an input buffer station 124, an output buffer station 126, a transfer robot 132, and a load cup assembly 128. The loading robot 116 places the substrate 114 onto the input buffer station 124. The transfer robot 132 has two gripper assemblies, each having pneumatic gripper fingers that hold the substrate 114 by the substrate's edge. The transfer robot 132 lifts the substrate 114 from the input buffer station 124 and rotates the gripper and substrate 114 to position the substrate 114 over the load cup assembly 128, then places the substrate 114 down onto the load cup assembly 128. An example of a transfer station that may be used to advantage is described in U.S. patent application Ser. No. 09/414,771, filed Oct. 1, 1999 by Tobin, which is hereby incorporated by reference in its entirety.

The carousel 112 generally supports a plurality of polishing heads 130, each of which retain one substrate 114 during processing. The carousel 112 transfers the polishing heads 130 between the transfer station 110, the one or more plating stations 102 and the one or more polishing stations 106. One carousel 112 that may be adapted to benefit from the invention is generally described in U.S. Pat. No. 5,804,507, issued Sep. 8, 1998 to Tolles et al., which is hereby incorporated by reference in its entirety.

Generally, the carousel 112 is centrally disposed on the base 108. The carousel 112 typically includes a plurality of arms 138. Each arm 138 generally supports one of the polishing heads 130. One of the arms 138 depicted in FIG. 1 is not shown so that the transfer station 110 may be seen. The carousel 112 is indexable such that the polishing head 130 may be moved between the modules 102, 106 and the transfer station 110 in a sequence defined by the user.

Generally the polishing head 130 retains the substrate 114 while the substrate 114 is disposed in the plating station 102 or polishing station 106. The arrangement of the plating stations 106 and polishing stations 102 on the apparatus 100 allow for the substrate 114 to be sequentially plated or polished by moving the substrate between stations while being retained in same the polishing head 130. One polishing head that may be adapted to be used in the invention is a TITAN™ wafer carrier, manufactured by Applied Materials, Inc., located in Santa Clara, Calif.

To facilitate control of the polishing apparatus 100 and processes performed thereon, a controller 140 comprising a central processing unit (CPU) 142, memory 144, and support circuits 146, is coupled to the polishing apparatus 100. The CPU 142 may be one of any form of computer processor that can be used in an industrial setting for controlling various drives and pressures. The memory 144 is coupled to the CPU 142. The memory 144, or computer-readable medium, may be one or more of readily available memory such as random access memory (RAM), read only memory (ROM), floppy disk, hard disk, or any other form of digital storage, local or remote. The support circuits 146 are coupled to the CPU 142 for supporting the processor in a conventional manner. These circuits include cache, power supplies, clock circuits, input/output circuitry, subsystems, and the like.

Figure 2:
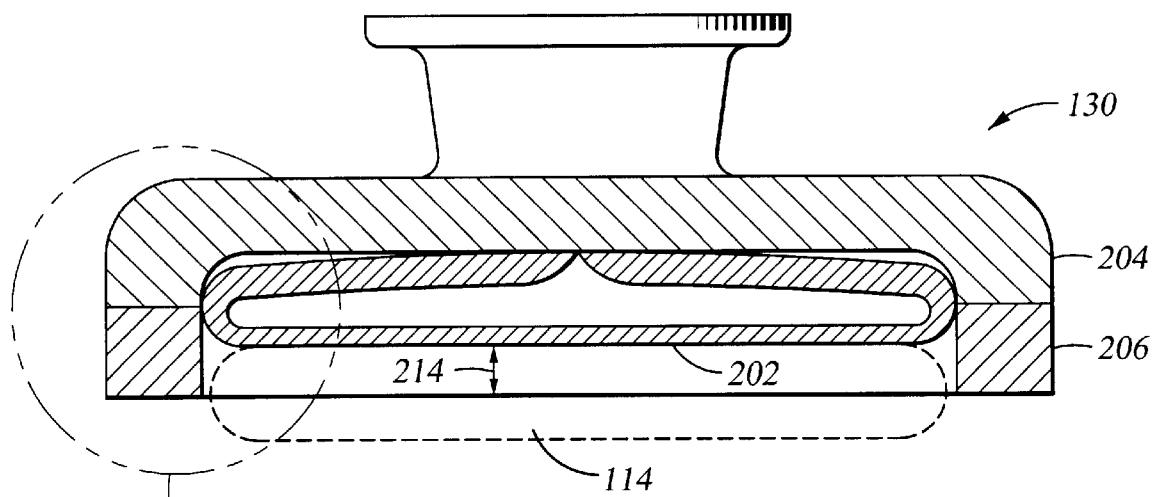
FIG. 2 is a cross-sectional view of one embodiment of a polishing head.
Figure 2:
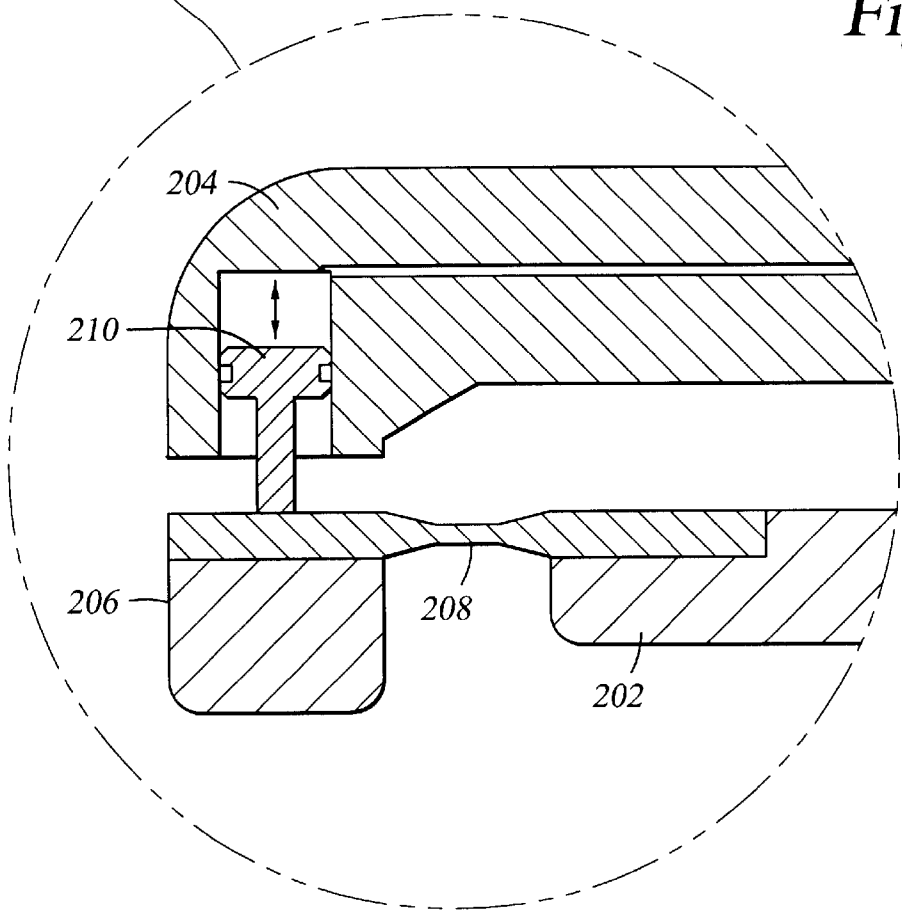

FIG. 2 depicts a sectional view of the polishing head 130. The polishing head 130 generally includes a carrier plate 202, a cover 204 and a retaining ring 206. The carrier plate 202, which in one embodiment may comprise an inflatable bladder, generally presses the substrate 114 against the polishing and plating stations 106, 102. The retaining ring 206 generally circumscribes the carrier plate 202 and prevents the substrate 114 from moving laterally out from under the polishing head 130 during processing.

Figure 3:
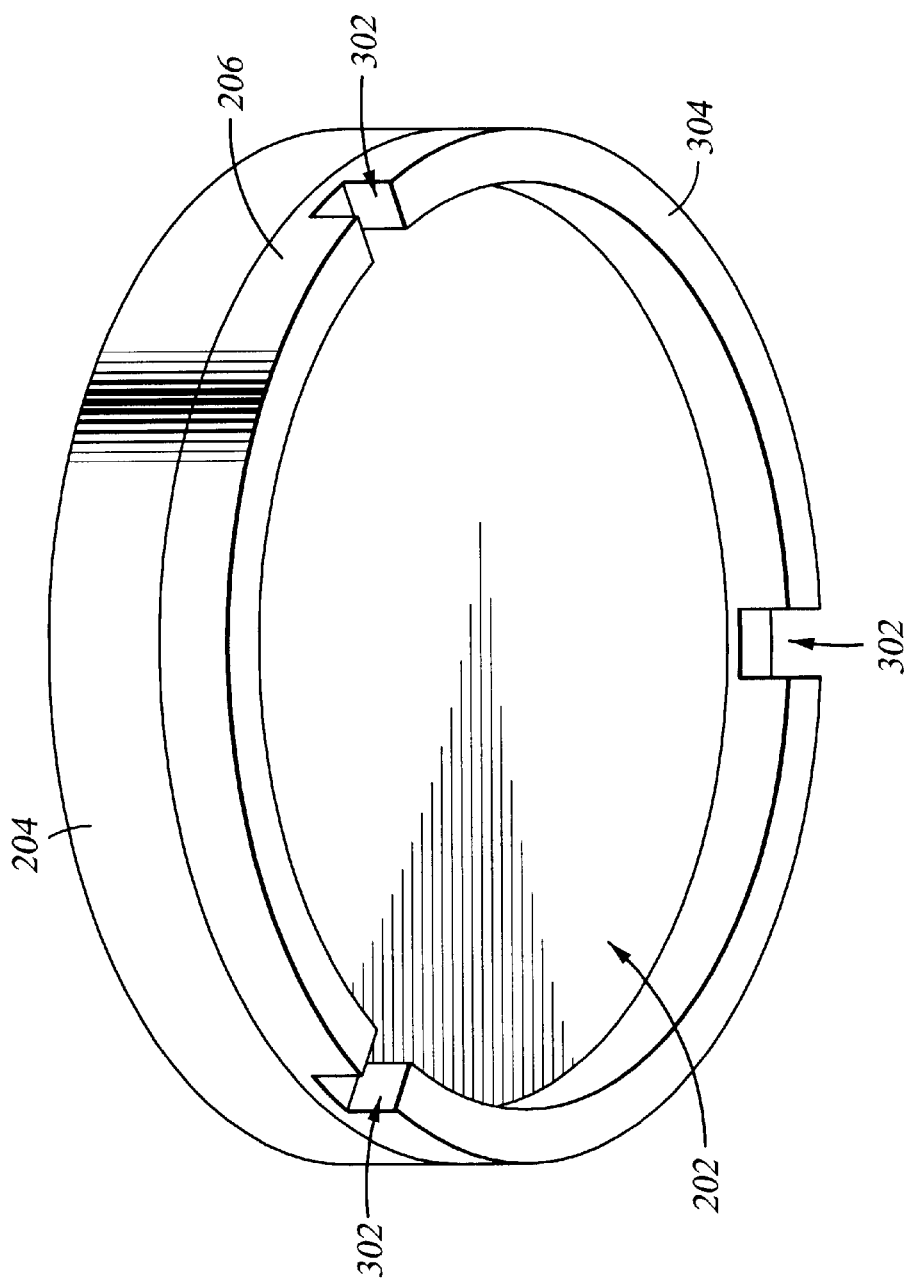
FIG. 3 is a perspective view of a retaining ring of the polishing head depicted in FIG. 2.

As depicted FIG. 3, the retaining ring 206 generally includes one or more grooves 302 disposed in a lower surface 304 of the retaining ring 206. The grooves 302 generally have a radial orientation. In one embodiment, the ring 206 contains at least three grooves.

Returning to FIG. 2, the carrier plate 202 and retaining ring 206 are generally movable relative to one another in an axial direction. A relative distance 214 between the carrier plate's bottom and the retaining ring 206 may be controlled thus setting the relative distance that the substrate 114 extends beyond the retaining ring 206, or the amount of pressure the retaining ring 206 exerts upon the polishing or processing table 106, 102.

In the embodiment depicted in the enlargement of FIG. 2, the retaining ring 206 is movably coupled to the polishing head 130 by a flexure 208. The flexure 208, which may be a flexible metal sheet or polymer, is disposed between the retaining ring 206 and the carrier plate 202 to allow axial movement therebetween. A piston 210 disposed in the cover 204 is coupled to the retaining ring 206. Fluid is supplied to (or removed from) the piston 210 and urges the retaining ring 206 in the axial direction, thereby defining the distance 214. Examples of other embodiments of polishing heads 130 that have a retaining ring and a carrier plate positionable relative to each other are described in U.S. Pat. No. 6,024,630, issued Feb. 25, 2000 to Shendon, et al.; U.S. patent application Ser. No. 08/861,260, filed May 21, 1997 by Zuniga; and U.S. patent application Ser. No. 09/258,042, filed Feb. 25, 1999 by Somer, et al., all of which are hereby incorporated by reference in their entireties.

Figure 4:
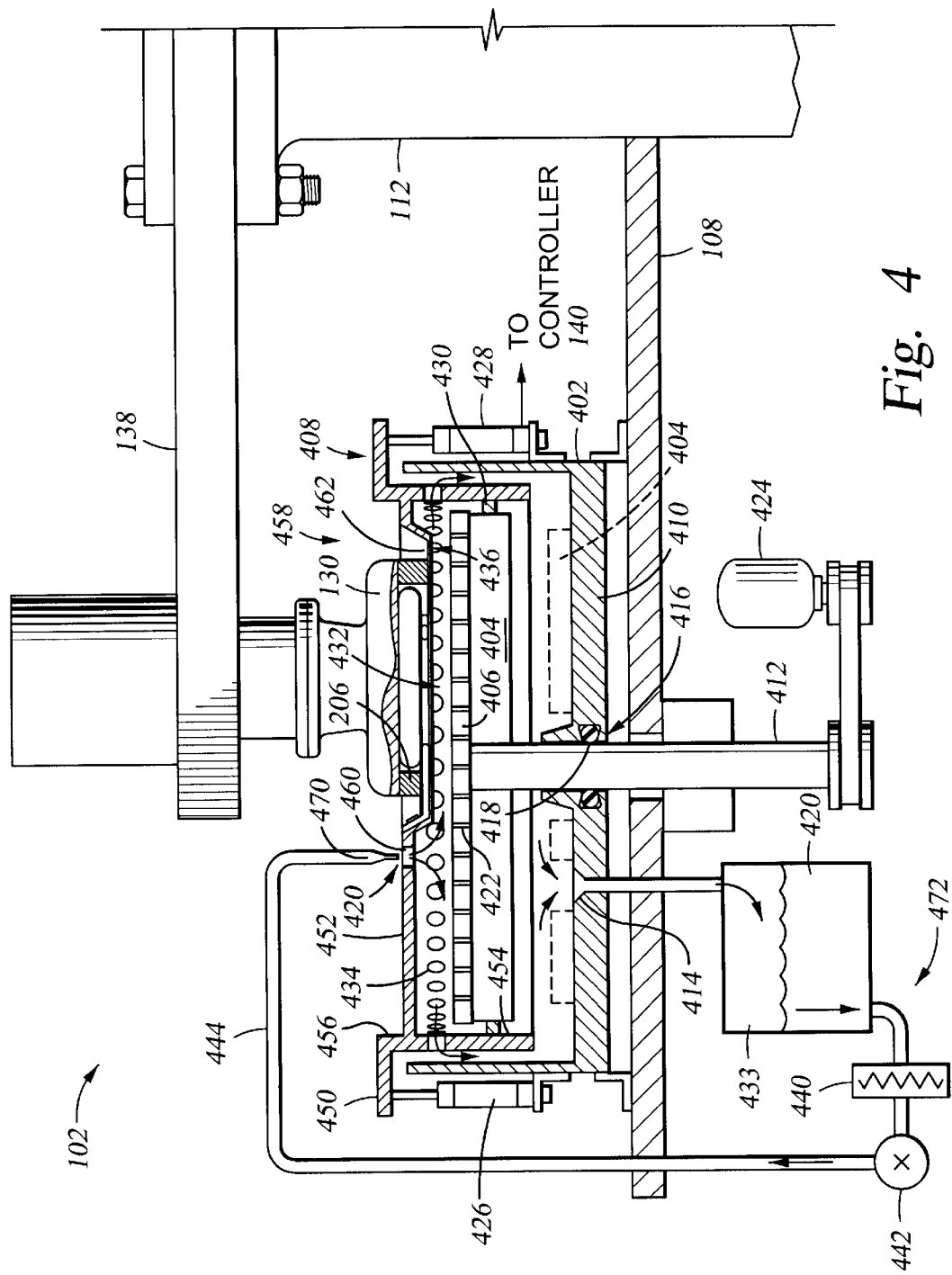
FIG. 4 is a sectional view of one embodiment of a plating station.

FIG. 4 depicts a sectional view of the polishing head 130 supported above the plating station 102. The plating station 102 generally includes a basin 402, an anode 404, a disc 406 and a cover 408. In one embodiment, the basin 402 is coupled to the base 108 of the polishing apparatus 100. The basin 402 generally defines a container or electrolyte cell in which a deposition fluid such as an electrolyte 420 can be confined. The electrolyte 420 used in processing the substrate 114 can include metals such as copper, aluminum, tungsten, gold, silver or other materials which can be electrochemically deposited onto the substrate 114. As one example, copper sulfate ($CuSO_4$) can be used as the electrolyte. One source for electrolyte solutions used for copper plating is Shipley Leonel, a division of Rohm and Haas, headquartered in Philadelphia, Pa., under the tradename Ultrafill 2000. Examples of other electrolytes (i.e., plating solutions) are disclosed in U.S. patent application Ser. No. 09/599,125, filed Jun. 22, 2000 by Cheung, et al., which is incorporated by reference in its entirety.

The basin 402 can be a bowl shaped member made of a plastic such as fluoropolymers, TEFLON®, PFA, PE, PES, or other materials that are compatible with plating chemistries. The basin 402 has a bottom 410 that includes an aperture 416 and a drain 414. The aperture 416 is generally disposed in the center of the bottom 410 and allows a shaft 412 to pass therethrough. A seal 418 is disposed between the aperture 416 and the shaft 412 and allows the shaft 412 to rotate while preventing plating fluids disposed in the basin 402 from passing through the aperture 416.

In another embodiment, the basin 402, cover 408 and disc 406 are movably disposed on the base 108. The basin 402, cover 408 and disc 406 may be axially moved toward the base 108 to facilitate clearance of the polishing head 130 as the carousel 112 indexes the substrate 114 between the plating and polishing stations 102, 106.

The disc 406 is disposed in the basin 402 and coupled to the shaft 412. The disc 406 may be fabricated from a material compatible with the electrolyte 420 such as a polymer, for example fluoropolymers, PE, TEFLON®, PFA, PES, HDPE, UHMW or the like. The disc 406 is generally permeable to the electrolyte 420. In one embodiment, the disc 406 includes a plurality of holes or channels 422 formed therein. The hole size and density is selected to provide uniform distribution of the electrolyte 420 through the disc 406 to the substrate 114.

The shaft 412 is generally coupled to a motor 424 disposed below the base 108. The motor 424, in response to a signal from the controller 140, rotates the disc 406 at a predetermined rate.

The anode 404 is generally positioned between the disc 406 and the bottom 410 of the basin 402 where it may be immersed in the electrolyte 420. The anode 404 can be a plate-like member, a plate having multiple holes formed therethrough or a plurality of anode pieces disposed in a permeable membrane or container. A permeable membrane (not shown) may be disposed between the disc 406 and the anode 404 to prevent particles or sludge from being released from the anode 404 into the electrolyte. The anode 404 is comprised of the material to be deposited, such as copper, aluminum, gold, silver, tungsten and other materials which can be electrochemically deposited on the substrate 114. In at least one embodiment, the anode 404 is disposed proximate the disc 406 and is ring-shaped, defining a central opening through which the shaft 412 is disposed. In embodiments where the anode 404 is plate-like, a plurality of holes may be formed in through the anode 404 to allow passage of electrolyte 420 therethrough. The anode 404 can alternatively be a ring anode, a plate anode, or a chamber confining plating material. The anode 404 may alternatively be spaced from the disc 406 to provide a wider process window, thus reducing the sensitivity of plating film thickness to the anode dimensions.

The cover 408 is generally disposed over the basin 402. The cover 408 confines the electrolyte 420 within the basin 402 of the polishing station 102. Additionally, the cover 408 positions the substrate 114 in the polishing station 102 during processing. The axial (e.g., vertical) position of the cover 408 relative to the basin 402 is controllable to regulate the plating process. In one embodiment, a plurality of actuators 426 are disposed between the cover 408 and the basin 402 to facilitate the relative positioning of the cover 408. The actuators 426, which may be a cylinder, a lead screw and motor, a solenoid or other motion device, generally allows the cover 408 to be axially positioned at a predetermined distance in relation to the basin 402. Typically a sensor 428 is coupled to the controller 140 and provides positional feedback utilized to control to the actuator 426. Accordingly, the axial position of the cover 408 in the plating station 102 may be accurately controlled. In one embodiment, the actuator 426 is a linear actuator having a stepper motor that drives a lead screw. The sensor 428 is a linear voltage distance transducer (LVDT) that is coupled between the cover 408 and the basin 402. The sensors 428 may be positioned around the perimeter of the basin 402 to maintain parallelism between the basin 402 and the cover 408. Alternatively, other sensors 428 may be utilized to detect the relative position of the cover 408 and basin 402. For example, the sensor 428 may alternatively be a pressure sensor disposed in the cover 408 to detect the force of the cover 408 against the disc 406.

In one embodiment, the cover 408 includes a flange 450, a center portion 452, a cylindrical body 456 and a skirt 454. The flange 450 is generally a flat ring that extends beyond the upper edge of the basin 402. The flange 450 provides a mounting surface for the sensors 428 and actuators 426 disposed between the cover 408 and basin 402. The cylindrical body 456 couples the flange 450 and the center portion 452.

The center portion 452 generally includes at least a first aperture 460 and a second aperture 462. The second aperture 462 is disposed in a depression 458 formed in the center portion 452 of the cover 408. The first aperture 460 is positioned below a nozzle 470 of a plating fluid delivery system 472. Electrolyte 420 flowing from the nozzle 470 passes through the first aperture 460 and onto the disc 406. The first aperture 460 is typically positioned above the center of the rotating disc 406 so that the electrolyte 420 is evenly distributed across the disc 406 (and correspondingly uniformly across the substrate 114). Alternatively, the first aperture 460 may be positioned off center.

The second aperture 462 is disposed in the center portion 452 of the cover 408 offset from the centerline of the plating station 102 (i.e., the center of rotation). The second aperture 462 allows the substrate 114 held in the polishing head 130 to access the electrolyte 420 disposed in the plating station 102 during processing.

Figure 5:
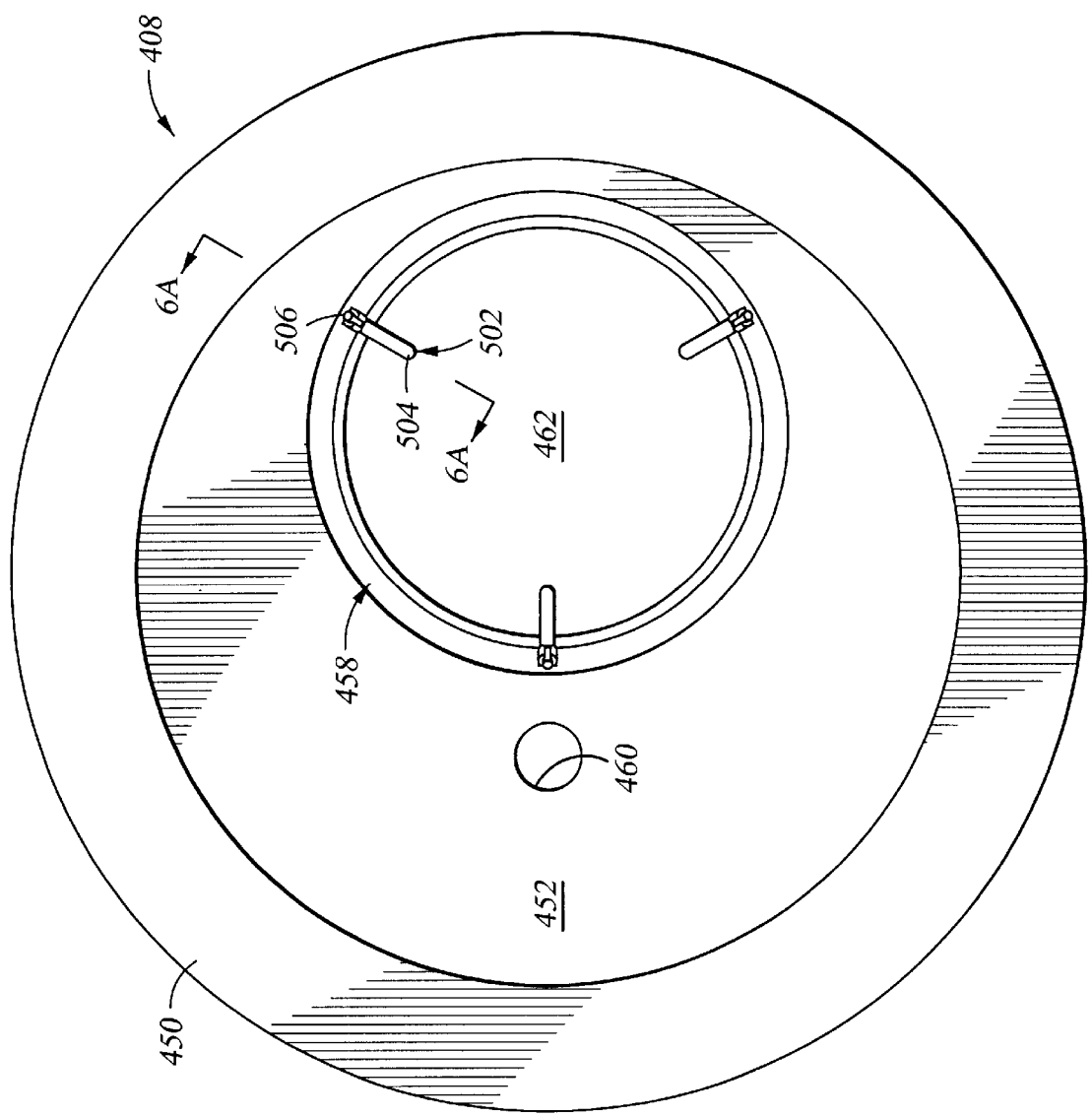
FIG. 5 is a plan view of one embodiment of a cover.

Referring to the plan view of the cover 408 depicted in FIG. 5, the second aperture 462 includes a plurality of contact pins 502 extending inwardly into the aperture 462 upon which the substrate 114 rests. The contact pins 502 are generally comprised of a conductive material, such as copper. The contact pins 502 have a first section 504 and a second section 506. The first section 504 and the second section 506 are generally set at an obtuse angle relative to one another. The first sections 504 of the contact pins 502 are generally orientated radially in a polar array. The first sections 504 define a plane that is generally parallel to the planes of the cover 408, basin 402 and disc 406. As the polishing head 130 is disposed in the second aperture 462, the contact pins 502 interface with (i.e., fit within) the grooves 302 of the retaining ring 206, thus allowing the pins 502 to contact the substrate 114. The grooves 302 and contact pins 502 may be configured to maintain the lower surface 304 of the substrate 114 in a predetermined position relative to the cover 204. In one embodiment, the substrate 114 is co-planar with the bottom of the cover 204.

Figure 6A:
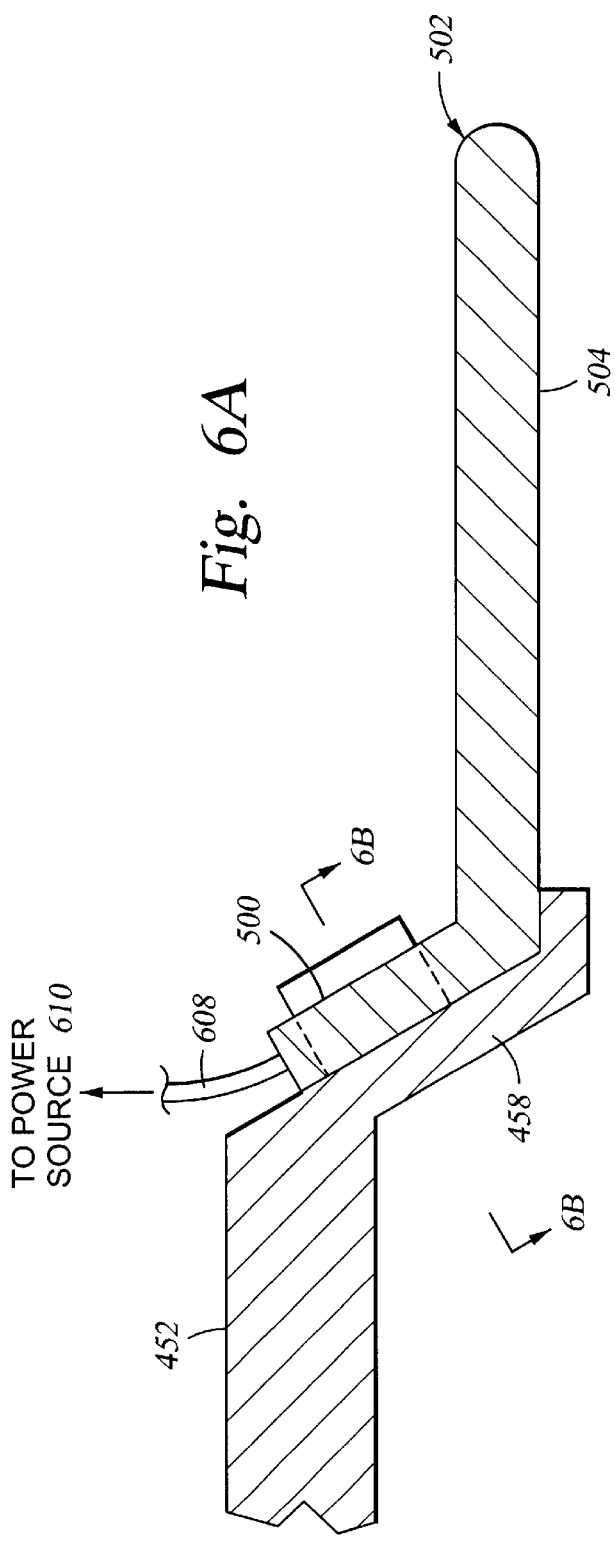
FIGS. 6A and 6B depict partial sectional views of the cover taken along section line 6A—6A of FIG. 5 and section line 6B-7B of FIG. 6A.
Figure 6B:
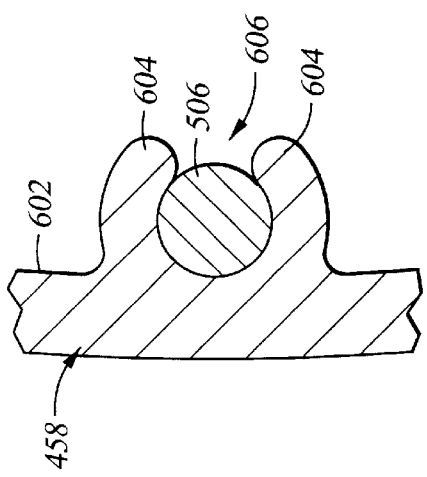

FIGS. 6A and 6B depict sectional views of the cover 408 and the second section 506 of the contact pins 502. A wall 602 of the depression 458 generally includes a plurality of paired members 604 having a slot 606 defined therebetween. The slot 606 is configured to accept and retain the second section 506 of the contact pins 502. A lead 608 is generally coupled to the second end of each contact pin 502 and electrically couples the contact pins 502 to a power source 610 that is used to bias the substrate 114 via the contact pins 502. Generally, the power source 610 causes a current of about 0.5 amp to about 20 amp to flow through the electrolyte 420 between the substrate 114 and the anode 404. Alternatively, a conductive trace may be disposed in the cover 204 to electrically couple the contact pins 502 to the power source 482.

Returning to FIG. 4, the skirt 454 generally extends from the cylindrical body 256 and circumscribes the disc 406. The skirt 454 and the disc 406 may be configured to form an annular orifice therebetween, thus regulating the flow of electrolyte 420 passing between the cover 408 and disc 406. Optionally, a seal 430 may be disposed between the skirt 454 and the anode 404 to further control the flow of electrolyte 420. As the skirt 454 and the seal 430 control the flow of electrolyte 420 flowing off the disc 406, the electrolyte 420 fills a volume 432 defined between the cover 408 and disc 406. The electrolyte 420 is prevented from overflowing the volume 432 by a plurality of holes 434 disposed in the skirt 454. The holes 434 generally provide a path through the cover 408 for the electrolyte 420 exiting the volume 432 and flowing into the lower portion of the basin 402. The holes 434 are generally positioned between a lower surface 436 of the depression 458 and the center portion 452. As the holes 434 are typically higher than the lower surface 436 of the depression 458, the electrolyte 420 fills the volume 432 and is thus brought into contact with the substrate 114 supported on the contact pins 502. Thus, the substrate 114 maintains contact with the electrolyte 420 through the complete range of relative spacing between the cover 408 and the disc 406.

The electrolyte 420 collected in the basin 402 generally flows through the drain 414 disposed at the bottom 410 into the plating fluid delivery system 472. The plating fluid delivery system 472 typically includes a reservoir 438 and a pump 442. The electrolyte 420 flowing into the plating fluid delivery system 472 is collected in the reservoir 438. The pump 442 transfers the electrolyte 420 from the reservoir 438 through a supply line 444 to the nozzle 470 where the electrolyte 420 recycled through the plating station 102. A filter 440 is generally disposed between the reservoir 438 and the nozzle 470 to remove particles and agglomerated material that may be present in the electrolyte 420.

Figure 7:
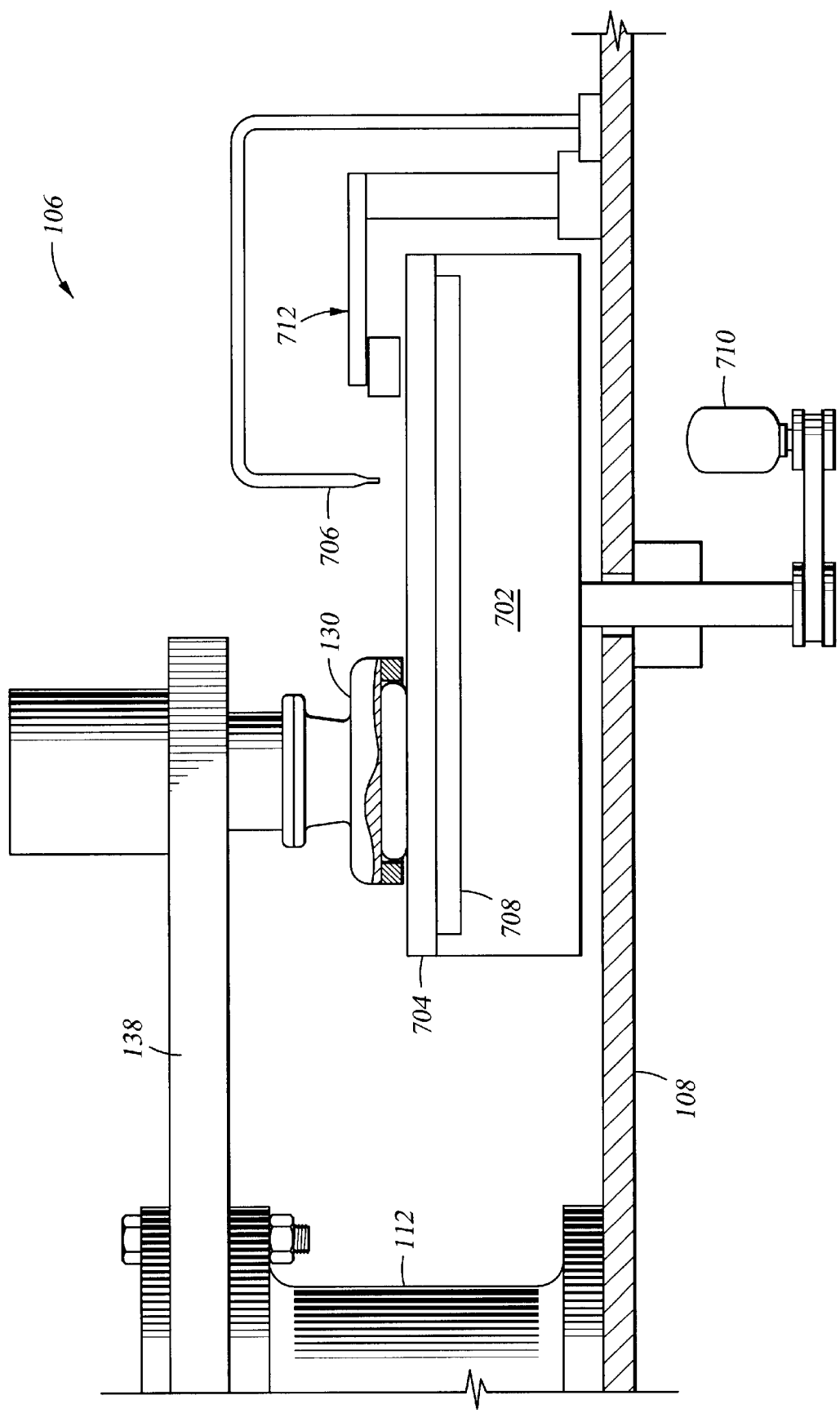
FIG. 7 is an elevation of one embodiment of a polishing station.

FIG. 7 depicts a sectional view of the polishing head 130 supported above the polishing station 106. The polishing station generally includes a platen 702 having a polishing material 704 disposed thereon. The polishing head 130 typically presses the substrate 114 against the polishing material 704 while relative motion is provided therebetween.

In one embodiment, the platen 702 is coupled to a motor 710 that provides rotation to the platen 702. The platen 702 generally includes a subpad 708 that is disposed between the platen 702 and polishing material 704. The subpad 708 is generally comprised of one or more polymers and is selected to contribute to an effective modulus of the platen 702, polishing pad 704 and subpad 708 that produces a desired polishing result.

In one embodiment, the polishing material 704 is a pad of foamed polyurethane. Conventional polishing material typically uses polishing fluids that include entrained abrasives. Conventional material is available from Rodel, Inc., of Newark, Del. A polishing station 106 that may be adapted to benefit from the invention is described in the previously incorporated U.S. Pat. No. 5,804,507.

A nozzle 706 typically provides a polishing fluid to the polishing material 704 that assists in the planarization of the substrate 114. Generally, the polishing fluid is selected to produce a particular result when polishing a specific material. For example, polishing fluids utilized with conventional polishing material typically contain abrasives while fluids utilized with fixed abrasive material typically do not contain abrasives. An example of one polishing fluid disposed on conventional polishing material to polish a substrate having an exposed oxide layer generally contains potassium hydroxide (KOH).

Generally, a conditioning device 712 is disposed adjacent the polishing station 106. The conditioning device 712 is utilized to maintain the polishing material 704 in a state that produces repeatable polishing results. In one embodiment, the conditioning device 712 is a rotating disk having a diamond dressing surface.

Alternatively, the polishing material 704 may be a fixed abrasive. Fixed abrasive polishing material is generally utilized in the form of a web disposed across the platen between a supply roll and take-up roll removably coupled to the platen. Generally, fixed abrasive polishing material comprises a plurality of abrasive particles suspended in a resin binder that is disposed in discrete elements on a backing sheet. Examples of such fixed abrasive pads are described in U.S. Pat. No. 5,692,950, issued Dec. 2, 1997 to Rutherford et al. and U.S. Pat. No. 5,453,312, issued Sep. 26, 1995 to Haas et al., both of which are hereby incorporated by reference in their entirety. A polishing station 106 which utilizes fixed abrasive pads that may be adapted to benefit from the invention is described in U.S. patent application Ser. No. 09/244,456, filed Feb. 4, 1999 by Birang et al., which is hereby incorporated in its entirety.

Alternatively, in instances wherein a high degree of planarity is not required, the system 100 may comprise only plating stations 102. In such a configuration, the system 100 may include one or more annealing stations in place of the polishing station 106. Generally the annealing station has a controlled atmosphere, typically containing less than 100 ppm of oxygen in a nitrogen rich environment. The substrate 114 is placed in the annealing station and annealed at between about 200 to about 450 degrees Celsius for about 1 to about 5 minutes. An example of an annealing station that may be adapted to be utilized in the invention is described in U.S. Pat. No. 6,136,163, issued Oct. 24, 2000 to Cheung et al., which is hereby incorporated by reference in its entirety.

Figure 8:
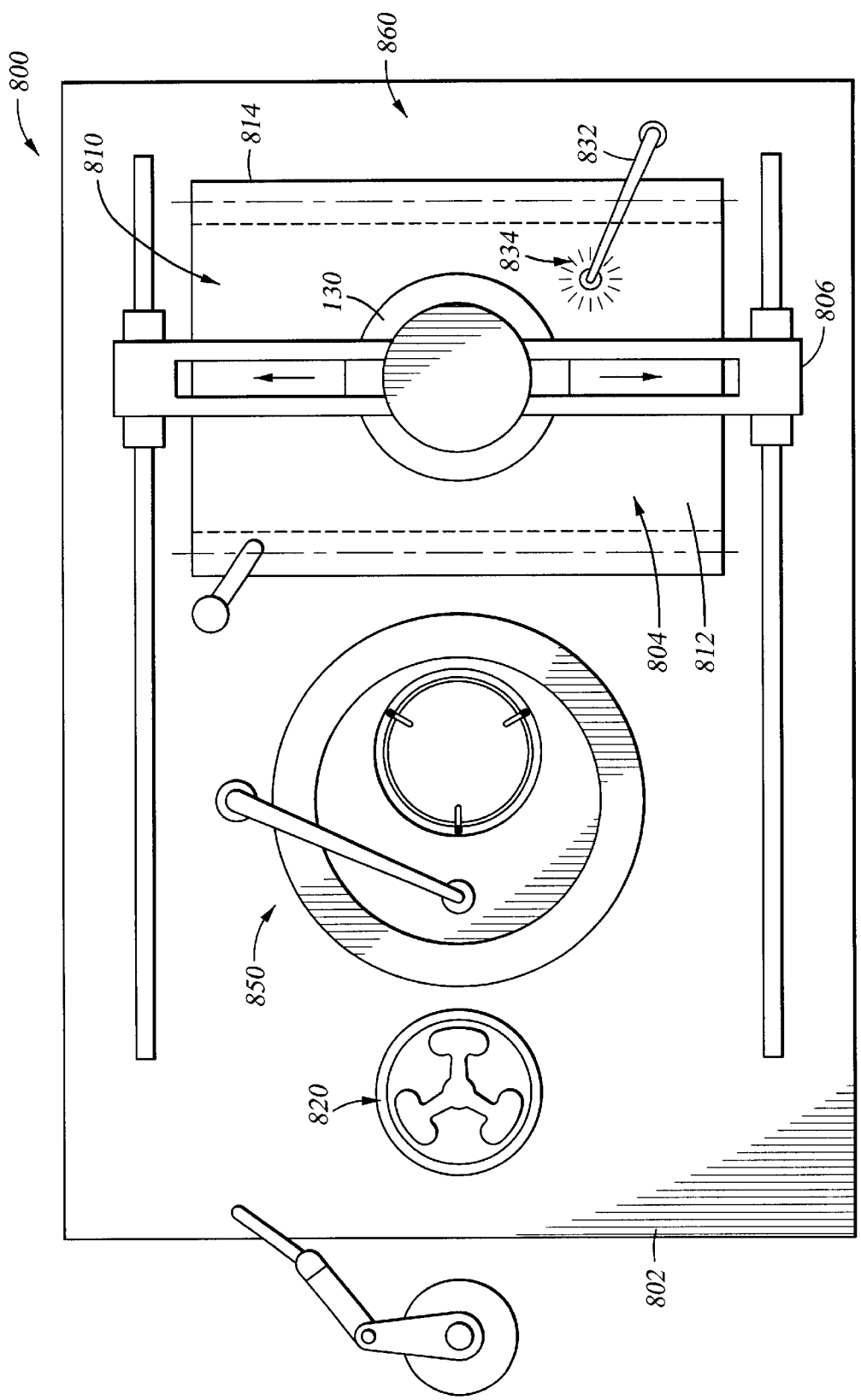
FIG. 8 is a plan view of another embodiment of a processing apparatus.
Figure 9:
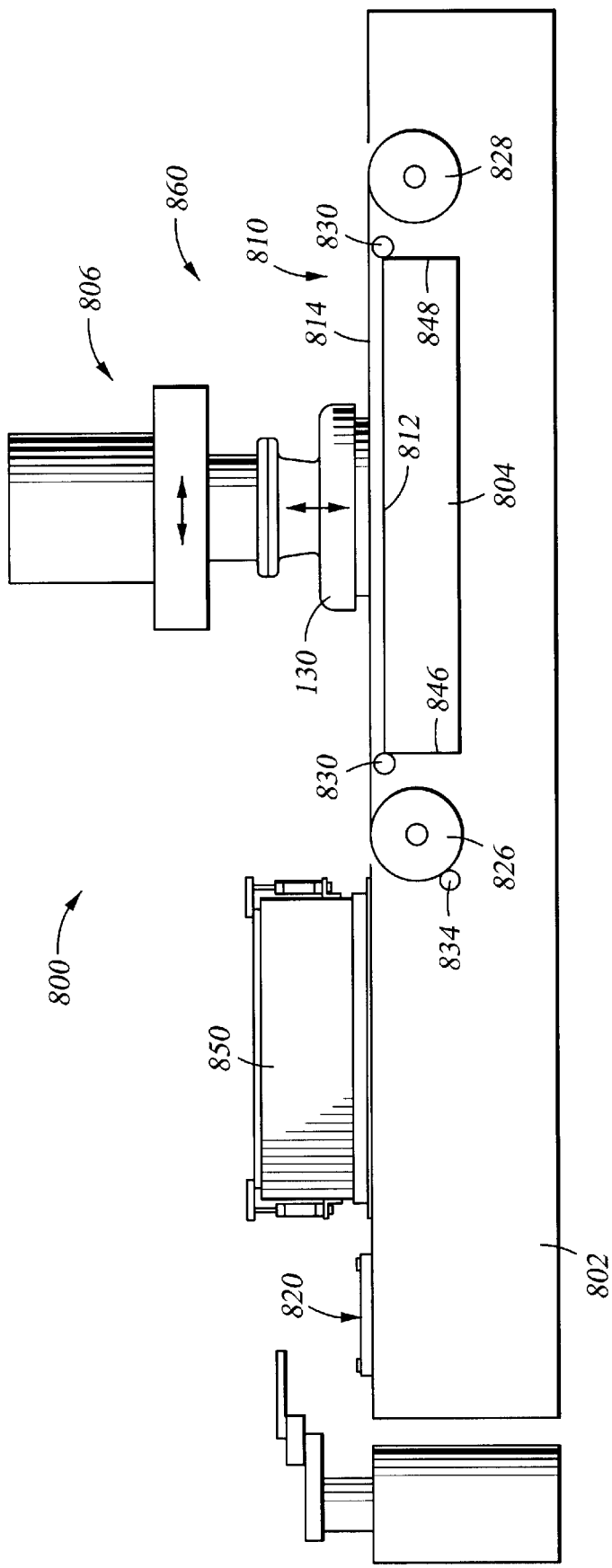
FIG. 9 is a elevation of the processing apparatus of FIG. 8.

FIGS. 8 and 9 depict another embodiment of a processing apparatus 800. The exemplary processing apparatus 800 generally includes plating station 850, a polishing station 860, a load cup assembly 820, drive system 806 that are all coupled to a base 802. The plating station 850 and the load cup assembly 820 generally are substantially similar to the plating station 102 and load cup assembly 128 described with reference to FIG. 1. The polishing station 860 generally includes a platen 804 that has a top surface 812 supporting the polishing material 810. The platen 804 may include a subpad (not shown) disposed in the top surface 812 beneath the polishing material 810 to maintain an effective modulus of the polishing material 810, subpad and platen 804 stack at a predetermined value that produces a desired polishing result. The platen 804 is typically stationary. Alternatively, the platen 804 may move, for example, oscillating in a plane parallel to the substrate 114.

In one embodiment, the polishing material 810 is in the form of a web 814 that is generally disposed across a top surface 812 of the platen 804 between a supply roll 826 and take-up roll 828. An unused portion of the web 814 is typically stored on the supply roll 826. The supply roll 826 is coupled to a first end 846 of the platen 804. The take-up roll 828 that stores a used portion of the web 814 is generally coupled to an opposing (second) end 848 of the platen 804. Optionally, the used portion of the web 814 may be routed under the top surface 812 of the platen 804 so that the take-up roll 828 may be situated at the first end 846 of the platen 804 near the supply roll 826 to facilitate web replacement from a single end of the base 802. Generally, rollers 830 are disposed proximate the top surface 812 at each end 846, 848 of the platen 804 to prevent the web 814 from becoming damaged by the platen 804 when moving across the top surface 812. The supply roll 826 and the take-up roll 828 typically are coupled to drive motors (not shown) to controllably advance the web 814 therebetween.

A conditioning mechanism (not shown) is coupled to the base 802 to prepare the unused portion of the web 814 for processing. Generally, the conditioning mechanism includes a patterned or abrasive surface that planarizes the web 814 while exposing abrasive articles on the working surface of the web 814.

A polishing fluid delivery tube 832 is provided to dispense a polishing fluid 834 onto the web 814. The tube 832 is typically coupled to the base 802 but may alternatively be coupled to the drive system 806 or polishing head 130. The delivery tube 832 is fluidly coupled to a polishing fluid delivery system (not shown). In one embodiment, the delivery of the polishing fluid 834 is substantially similar to the delivery of fluid provided by the delivery system 472 described with reference to FIG. 4.

The drive system 806 is coupled to platen 804 and supports the polishing head 130 above the web 814 of polishing material. Generally, the drive system 806 provides x/y motion to the polishing head 130 so that the substrate 114 retained in the polishing head 130 is moved in a programmed pattern while pressing the substrate 114 against the web 814 of polishing material 810. A polishing station that may be adapted to benefit from the invention is described in U.S. Patent Provisional Application No. 60/185,812, filed Feb. 29, 2000, which is hereby incorporated by reference in its entirety.

The following is an exemplary processing sequence for depositing and planarizing a material layer on a substrate 114 utilizing the processing apparatus 100. It should be noted that other processing sequences are easily derived utilizing the teachings described herein, and accordingly anticipated by the inventors. The substrate 114 is first positioned in a polishing head 130 and moved over the cover 408 of the plating station 102. The substrate 114 is then lowered to contact the contact pins 502 extending into the second aperture 462 in the cover 408. The substrate 114 is typically located above the permeable disc 406 at a distance in the range of about 100 $\mu$m to about 500 $\mu$m. Electrolyte 420 is provided between the substrate 114 and disc 406. A low current in the range of about 0.5 Amp to about 20 Amp is initially applied to the substrate 114 through the contact pins 502. The current between the substrate 114 and anode 404 cause metal ions present in the electrolyte 420 to move towards and deposit on the substrate 114. Typically, about 1000–3000 Å or less of material is deposited on the substrate 114. More or less material may be deposited depending on the size of features to be filled. Smaller features need less total deposition to be filled, while larger features require more material to be deposited.

To promote planarity of the deposited material, the disc 406 is rotated in proximity to the substrate 114. A centrifugal force in the fluid created by the rotating disc 406 causes the fluid to flow outwardly between the substrate 114 and disc 406. It is believed that the flowing fluid erodes provides a planarizing action that promotes flatness in the deposited material during deposition.

After processing is completed at the plating station 102, the substrate 114 retained in the polishing head 130 is rotated to one of the polishing stations 106. The substrate 114 is then pressed against the polishing material 704. The substrate 114 and polishing material 704 are moved relative to one another in the presence of a polishing fluid to planarize the substrate 114.

Although the invention is generally described with reference to an apparatus having the exemplary configurations described above, the invention may be practiced in other configurations. For example, a polishing station may be configured to hold a polishing head stationary while a moving web of polishing material is passed thereunder.

Additionally, other configurations of the apparatus may be devised. For example, the apparatus may include two plating stations and one polishing station.

While foregoing is directed to the preferred embodiment of the present invention, other and further embodiments of the invention may be devised without departing from the basic scope thereof, and the scope thereof is determined by the claims that follow.

What is claimed is:

1. An apparatus for depositing and polishing a material on a substrate, comprising:
   a basin;
   a cover disposed over the basin and having a first aperture disposed therein;
   a plurality of pins extending radially into the first aperture adapted to support the substrate;
   a permeable disc disposed in the basin between the cover and a bottom of the basin;
   an anode disposed in the basin between the disc and the bottom of the basin; and
   a polishing head adapted to retain the substrate during processing, the polishing head having a retaining ring, the retaining ring having a plurality of grooves disposed therein, the grooves mating with the pins when the polishing head is disposed in the aperture.

2. The apparatus of claim 1, wherein the permeable disc further comprises a plurality of holes or channels disposed therein.

3. The apparatus of claim 1, wherein the permeable disc rotates within the cover.

4. The apparatus of claim 1, wherein the cover, permeable disc and basin move in an axial direction relative to the polishing head.

5. The apparatus of claim 1, wherein the cover is axially movable between at least a first position and a second position relative to the basin.

6. The apparatus of claim 5 further comprising:
   one or more actuators coupled between the cover and the basin.

7. The apparatus of claim 5 further comprising:
   one or more sensors for detecting an axial position of the cover relative to the basin.

8. The apparatus of claim 1, wherein the cover further comprises:
   a center portion, and
   a skirt extending from the center portion and circumscribing the disc.

9. The apparatus of claim 8, wherein the center portion of the cover comprises a depression extending towards a bottom of the basin, the first aperture disposed in the depression and adapted to receive the substrate.

10. The apparatus of claim 9, wherein the skirt further comprises a plurality of holes extending therethrough.

11. The apparatus of claim 10, wherein the holes are disposed at an elevation between planes defined by the depression and the center portion.

12. The apparatus of claim 11 further comprising a seal between the anode and the skirt, the seal creating a fluid path through the holes in the skirt.

13. The apparatus of claim 1, wherein the cover further comprises a second aperture adapted to have an electrolyte disposed therethrough.

14. The apparatus of claim 1 further comprising a plating fluid delivery system adapted to deliver an electrolyte between the disc and the substrate.

15. The apparatus of claim 14, wherein the basin further comprises a drain.

16. The apparatus of claim 15, wherein the fluid delivery system further comprises a filter disposed between the drain and a nozzle that flows electrolyte to the disc.

17. The apparatus of claim 1 further comprising one or more polishing stations disposed adjacent the cover.

18. The apparatus of claim 17 wherein the substrate is processed on the cover and polishing station without being removed from the polishing head.

19. An apparatus for depositing and polishing a material on a substrate, comprising:
   a base;
   one or more polishing stations disposed on the base;
   one or more plating stations disposed on the base, the plating station comprising:
      a basin disposed on the base;
      a cover disposed over the basin and having an aperture disposed therein;
      a plurality of pins extending radially into the aperture adapted to support the substrate;
      one or more actuators coupled between the cover and the basin, the actuators urging the cover axially between a first position and a second position relative to the basin;
      a permeable disc disposed in the basin between the cover and a bottom of the basin;
      an anode disposed in the basin between the disc and the bottom of the basin; and
   a polishing head adapted to retain the substrate during processing, the polishing head having a retaining ring, the retaining ring having a plurality of grooves disposed therein, the grooves mating with the pins when the polishing head is disposed in the aperture.

20. The apparatus of claim 19 further comprising:
   a load cup coupled to the base and adapted to transfer the substrate to the polishing head; and
   a loading robot adapted to transfer the substrate to the load cup.

21. The apparatus of claim 20, wherein the loading robot transfers the substrate between the load cup and at least one module selected from the group consisting of a cleaning module, a substrate storage cassette, a factory interface or another processing apparatus.

22. The apparatus of claim 19, wherein the permeable disc rotates and further comprises a plurality of holes or channels disposed therein.

23. The apparatus of claim 22, wherein the cover, permeable disc and basin move in an axial direction relative to the polishing head.

24. The apparatus of claim 19 further comprising:
   one or more sensors for detecting an axial position of the cover relative to the basin.

25. The apparatus of claim 19, wherein the cover further comprises:
   a center portion;
   a depression disposed in the center portion and extending towards a bottom of the basin, the first aperture adapted to receive the substrate, first aperture disposed in the depression, and
   a skirt extending from the center portion and circumscribing the disc.

26. The apparatus of claim 25, wherein the skirt further comprises a plurality of holes disposed at an elevation between planes defined by the depression and the center portion.

27. The apparatus of claim 25 further comprising an electrolyte fluid nozzle positioned to flow a fluid onto the disc.

28. The apparatus of claim 19, further comprising a plating fluid delivery system having a pump, a reservoir and a filter, the reservoir coupled to a drain disposed in the basin, the pump coupled to the reservoir for transferring the electrolyte from the reservoir through the filter and to a nozzle disposed above the cover, the nozzle flowing electrolyte through a second aperture in the cover and between the disc and the substrate.

29. The apparatus of claim 19, wherein the substrate is processed on the cover and polishing station without being removed from the polishing head.

30. An apparatus for depositing and polishing a material on a substrate, comprising:
   a base;
   a carousel disposed on the base and having a plurality of arms;
   one or more plating stations disposed on the base, the plating station comprising:
      a basin disposed on the base;
      a cover disposed over the basin and having an aperture disposed therein;
      a plurality of pins extending radially into the aperture adapted to support the substrate;
      one or more actuators coupled between the cover and the basin, the actuators urging the cover axially between a first position and a second position relative to the basin;
      a permeable disc disposed in the basin between the cover and a bottom of the basin;
      an anode disposed in the basin between the disc and the bottom of the basin; and
   a polishing head adapted to retain the substrate during processing, the polishing head having a retaining ring, the retaining ring having a plurality of grooves disposed therein, the grooves mating with the pins when the polishing head is disposed in the aperture.

31. The apparatus of claim 30 further comprising one or more annealing stations disposed on the base.

* * * * *